US007780313B2

(12) United States Patent
Lam et al.

(10) Patent No.: US 7,780,313 B2
(45) Date of Patent: Aug. 24, 2010

(54) PACKAGE STRUCTURE FOR LIGHT EMITTING DIODE

(75) Inventors: Chu-Fong Lam, Taipei (TW); Yi-Fan Liao, Taipei (TW)

(73) Assignee: E-Pin Optical Industry Co. Ltd, Taipei (TW)

( * ) Notice: Subject to any disclaimer, the term of this patent is extended or adjusted under 35 U.S.C. 154(b) by 193 days.

(21) Appl. No.: 12/284,370

(22) Filed: Sep. 22, 2008

(65) Prior Publication Data

US 2009/0237942 A1 Sep. 24, 2009

(30) Foreign Application Priority Data

Mar. 19, 2008 (TW) ............................ 97109736 A

(51) Int. Cl.
*F21V 33/00* (2006.01)

(52) U.S. Cl. ............ 362/249.02; 362/800; 362/311.02

(58) Field of Classification Search ................ 362/800, 362/249.02, 311.02
See application file for complete search history.

(56) References Cited

U.S. PATENT DOCUMENTS

| | | | | |
|---|---|---|---|---|
| 5,068,771 | A | 11/1991 | Savage, Jr. | |
| 5,440,468 | A | 8/1995 | Savage, Jr. | |
| 2004/0126913 | A1 | 7/2004 | Loh | |
| 2004/0190304 | A1 | 9/2004 | Sugimoto | |
| 2007/0002301 | A1 | 1/2007 | Venema | |
| 2007/0019409 | A1* | 1/2007 | Nawashiro et al. | 362/231 |
| 2007/0139931 | A1 | 6/2007 | Kim et al. | |
| 2008/0037258 | A1* | 2/2008 | Lin | 362/296 |
| 2008/0068823 | A1* | 3/2008 | Lim | 362/102 |
| 2008/0130275 | A1* | 6/2008 | Higley et al. | 362/184 |

FOREIGN PATENT DOCUMENTS

| | | |
|---|---|---|
| JP | 60-198412 | 10/1985 |
| JP | 03-191580 | 8/1991 |
| JP | 2000-150968 | 5/2000 |
| JP | 2007-080879 | 3/2007 |
| TW | 238542 B | 8/2005 |
| WO | WO 2006/109113 A2 | 10/2006 |

* cited by examiner

*Primary Examiner*—Laura Tso
(74) *Attorney, Agent, or Firm*—Hudak, Shunk & Farine Co. LPA

(57) ABSTRACT

A package structure for light emitting diode (LED) comprises a base, an LED die, an optical lens and a lens holder. The base comprises at least one holder cavity formed on its surface and at least one chase formed on its side surface. The lens holder comprises an opening, at least one holder stem and at least one wedge. The optical lens is arranged between the lens holder and the base, and also through the opening. The lens holder is fastened on the base by wedging the wedge with the chase and positioned on the base by embedding the holder stem into the holder cavity to enhance the positioning between the optical lens and the base, such that the optical lens can generate a desired light pattern. Therefore, the required time of a packaging process can be reduced, and the lens holder can be removed simply for replacing the optical lens, so the objective of changing the light pattern quickly can be achieved.

8 Claims, 7 Drawing Sheets

234
231
23
233
232
32
322
322
21
30
301
202
201
3

PACKAGE STRUCTURE FOR LIGHT EMITTING DIODE

FIELD OF THE INVENTION

The present invention relates to a package structure for light emitting diode, and more particularly to a technical field that utilizes a lens holder to fasten an optical lens on a base by wedged and provides the optical lens to be replaced quickly.

BACKGROUND OF THE INVENTION

A light emitting diode (LED) utilizes the principle that electrical energy is directly converted to light energy. An electric voltage is applied to both positive and negative electrode terminals of the semiconductor. When an electric current flows, electrons and holes meet and combine to release energy in the form of light. This is the light emitting principle for light emitting diodes. Depending on the different materials used in light emitting diodes, their dissimilar energy levels enable the photon energies to generate light of different wavelengths. Light emitting diodes have the advantages of compact volume, fast response rate, non-pollution and etc. These advantages allow light emitting diodes to be applied in every industrial field gradually. Also, high power light emitting diodes are progressively developed to solve the problem of insufficient brightness such that the diodes can also be applied in the field of lighting source and have a trend of substituting for conventional tungsten lamps little by little. They are the potential products for substituting conventional illumination systems in the future.

A light emitting diode is mainly comprised of a base, an LED die, an optical lens and a lens holder. The base is provided for supporting an LED die and conducting the electrodes. Structurally, the optical lens is usually fastened on the base with the lens holder, or the optical lens is bonded to the base by using an adhesive. In the structure as disclosure in US2004/0126913, the LED is assembled on a lead frame, and the optical lens is embedded in the base or on a reflector; or as disclosure in JP03-191580, the LED die and the optical lens are fastened by using the electric contacts; or as disclosure in WO2006/109113, the optical lens passes through a substrate which is fixed by way of melted plastic indexing means; or as disclosure in TW238542, a screw thread or a socket is used for fastening; or as disclosure in JP2007-080879, the optical lens is wedged on the base; other various package assemblies are as disclosure in JP2000-150968, U.S. Pat. No. 5,440,468, U.S. Pat. No. 5,068,771, US2007/002301, US2004/190304, US2007/139931, TWM313317 and the like respectively. Because an adhesive is applied between the LED die and the optical lens for fastening the optical lens and the base, the brightness is possible to be affected due to thermal aging or yellowing of the adhesive; and a lens holder applied to fasten the optical lens is a practical structure, such as described in JP60-198412. As illustrated in FIG. 1, a side view of a package structure for light emitting diode employing a lens holder is depicted. In the drawing, a package structure 1 comprises a base 10, an LED die 11, an optical lens 12 and a lens holder 13. The LED die 11 is arranged on the base 10, and the LED die is covered with the lens 12 which is located between the lens holder 13 and the base 10 and passed through an opening of the lens holder 13. The base 10 is provided with at least one through hole 101 on its surface, and the supporting stem 131 of the lens holder 13 is inserted into the through hole 101. The portion 19 of the supporting stem 131 exposed from the through hole 101 is then deformed by heat melting such that the supporting stem 131 is unable to come off the through hole, thereby achieving the purpose of fastening the optical lens 12 on the base with the lens holder 13. In addition to fasten the optical lens, such structure can be applied to suitably prevent the optical lens from separating from the base due to exceeding thermal expansion, particularly suitable for an LED with a special light pattern. The LED with a special light pattern structurally even more requires a secure joint between the optical lens and the base. However, it is difficult for such structure to accomplish the effect of positioning between the optical lens and the base. Also, the supporting stem 131 must be deformed by heat melting so it is hard to achieve the purposes of quick assembly or replacement.

With the increasingly popularization of LEDs, and application field of LEDs has become wider, a demand for the LEDs capable of generating special light patterns has arisen. The light emitting diode as shown in FIG. 2 emits a pentagonal light pattern. However, it is required for extremely exact positioning of the optical lens in the package structure for such light emitting diode capable of generating a special light pattern. Since the position of the optical lens is slightly changed or the optical lens is slightly turned, the quality of the light pattern of such LED would be affected. In the above package structure 1 of the prior art, the lens holder 13 and the optical lens 12 are fastened on the base 10 only in a manner which confines the supporting stem 131 of the lens holder 13 to the through hole 101. But after a long time of use, it is unavoidable for the package structure to be subjected to an external shake or vibration so that the portion 19 of the supporting stem exposed from the through hole cannot ever confine the supporting stem 131 to the through hole 101. This enables the lens holder 13 to be loosened and results in the movement or the rotation of the optical lens 12, which is possible to affect the light pattern of the LEDs.

Especially, if the LEDs made by using an adhesive or by the hot melt deformation of the supporting stem 131 is mounted in a light fitting or in other light emitters, its light pattern is limited to the fixation of the optical lens on the LED and unchangeable. When there is a demand for changing the light pattern, the entire LEDs must be replaced, thus causing inconvenience and an increased expense.

In order to eliminate the above-addressed problems, the inventors propose a package structure for light emitting diode based on their research for many years and plenty of practical experience, thereby accomplishing the foregoing expectations.

SUMMARY OF THE INVENTION

In view of the aforementioned problems, the primary objective of the present invention is to provide a package structure for light emitting diode so as to reduce the required time of a packaging process and take the enhanced fixation of the lens holder on the base and the enhanced positioning between the optical lens and the base into consideration; and further, the objective of replacing the optical lens quickly to change the light pattern can be achieved.

According to the objective of the present invention, a package structure for light emitting diode is proposed, which comprises a base, an LED die, an optical lens and a lens holder. The base has at least one holder cavity formed on its one surface and at least one chase formed on its one side surface. The LED die is arranged on the base to emit light. The optical lens covers the LED die to focus the light emitted by the LED die and generate a desired light pattern. The lens holder has an opening, at least one holder stem and a wedge. The optical lens is arranged between the lens holder and the base, and through the opening. The lens holder is fastened on the base by wedging the wedge with the chase and positioned on the base by embedding the holder stem into the holder cavity.

Furthermore, the optical lens may optionally further comprise at least one lens stem, and the base correspondingly has at least one lens cavity formed on its surface, and the optical lens is positioned on the base by embedding the lens stem into the lens cavity.

Moreover, the optical lens may optionally further comprise at least one lens alignment, and the lens holder has at least one corresponding holder alignment formed on the internal wall of its opening, and when the lens holder is fastened on the base, the optical lens is positioned by the lens holder in a manner of jointing the holder alignment to the lens alignment.

Additionally, the lens holder optionally further has a reflection layer formed on the internal wall surface of its opening.

In conclusion of above description, the package structure for light emitting diode according to the present invention presents the following advantages:

(1) According to the package structure for light emitting diode of the present invention, the required time of a packaging process can be reduced.

(2) According to the package structure for light emitting diode of the present invention, a lens holder can be preferably fastened and positioned on the base.

(3) According to the package structure for light emitting diode of the present invention, an optical lens can be preferably fastened and positioned on the base.

(4) The package structure for light emitting diode of the present invention can be disassembled simply for replacing the optical lens so that the objective of changing the light pattern quickly can be achieved.

DETAILED DESCRIPTION OF THE PREFERRED EMBODIMENTS

For a more clear, detailed and accurate description of the present invention, the structure and technical features of the present invention are illustrated in the following detailed description of the preferred embodiments in coordination with the following drawings. The embodiments disclosed below according to the present invention are examples directed to the main component parts of a package structure for light emitting diode according to the present invention. Therefore, although the embodiments disclosed below according to the present invention are applied to an LED, in the case of a common package structure having an LED, the other structures except the package structure disclosed in the present invention belong to ordinary technology. Thus, those skilled in the art will appreciate that the component parts of a package structure for light emitting diode according to the present invention are not limited to the structure of the embodiments disclosed below, that is, each component part of the light emitting diode should include various changes, modification and even equivalent alterations. For example, there is no restriction on the shape design and light pattern of the optical lens in the package structure for light emitting diode; or on the shape, thickness and material of the base; or on the shape, thickness and material of the lens holder; or on the jointing manner and shape of the stems and the cavities.

Figure 1:
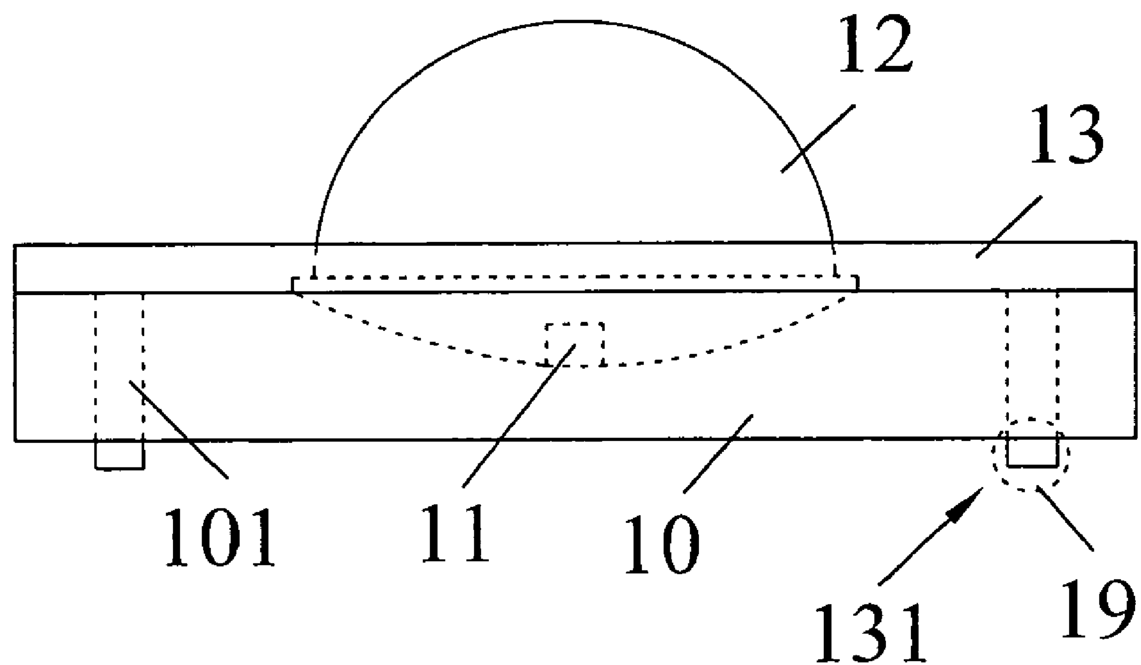
FIG. 1 depicts a side view of a package structure for light emitting diode of the prior art.
Figure 2:
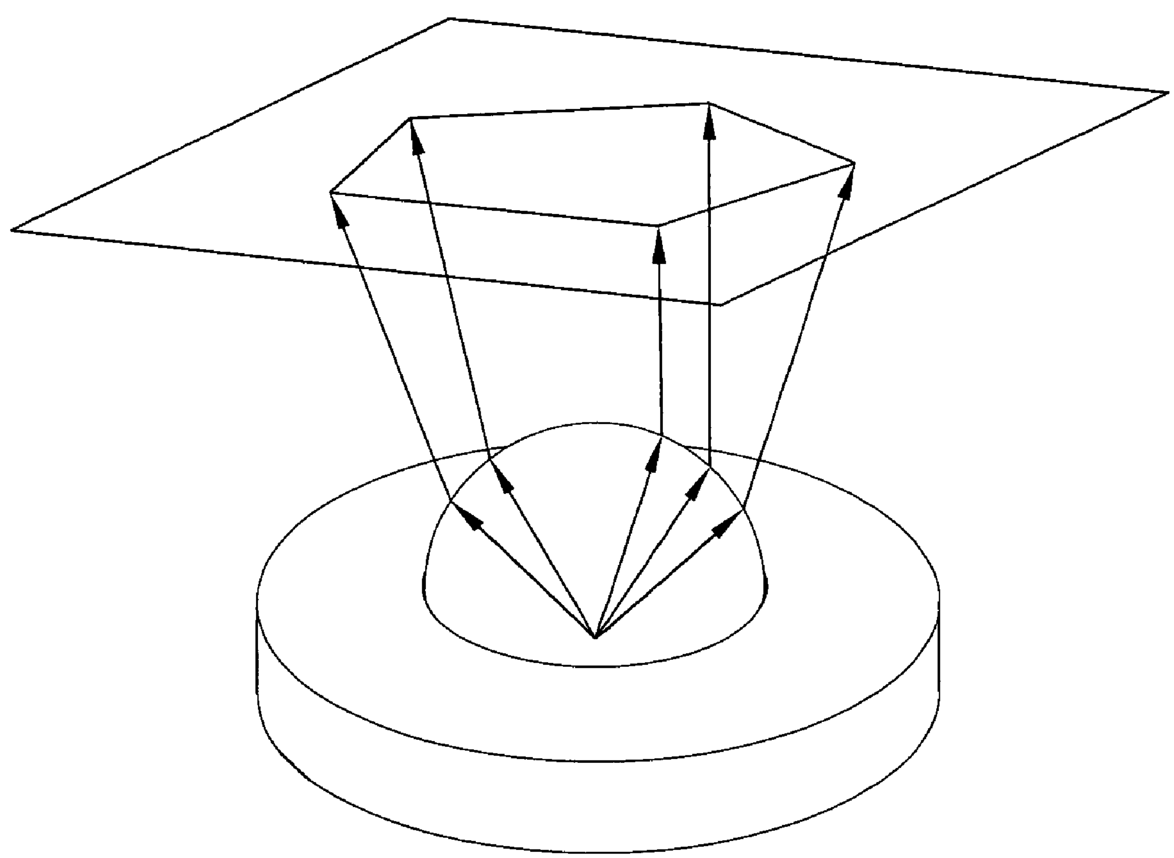
FIG. 2 depicts a schematic view showing a light emitting diode that emits a pentagonal light pattern.
Figure 3:
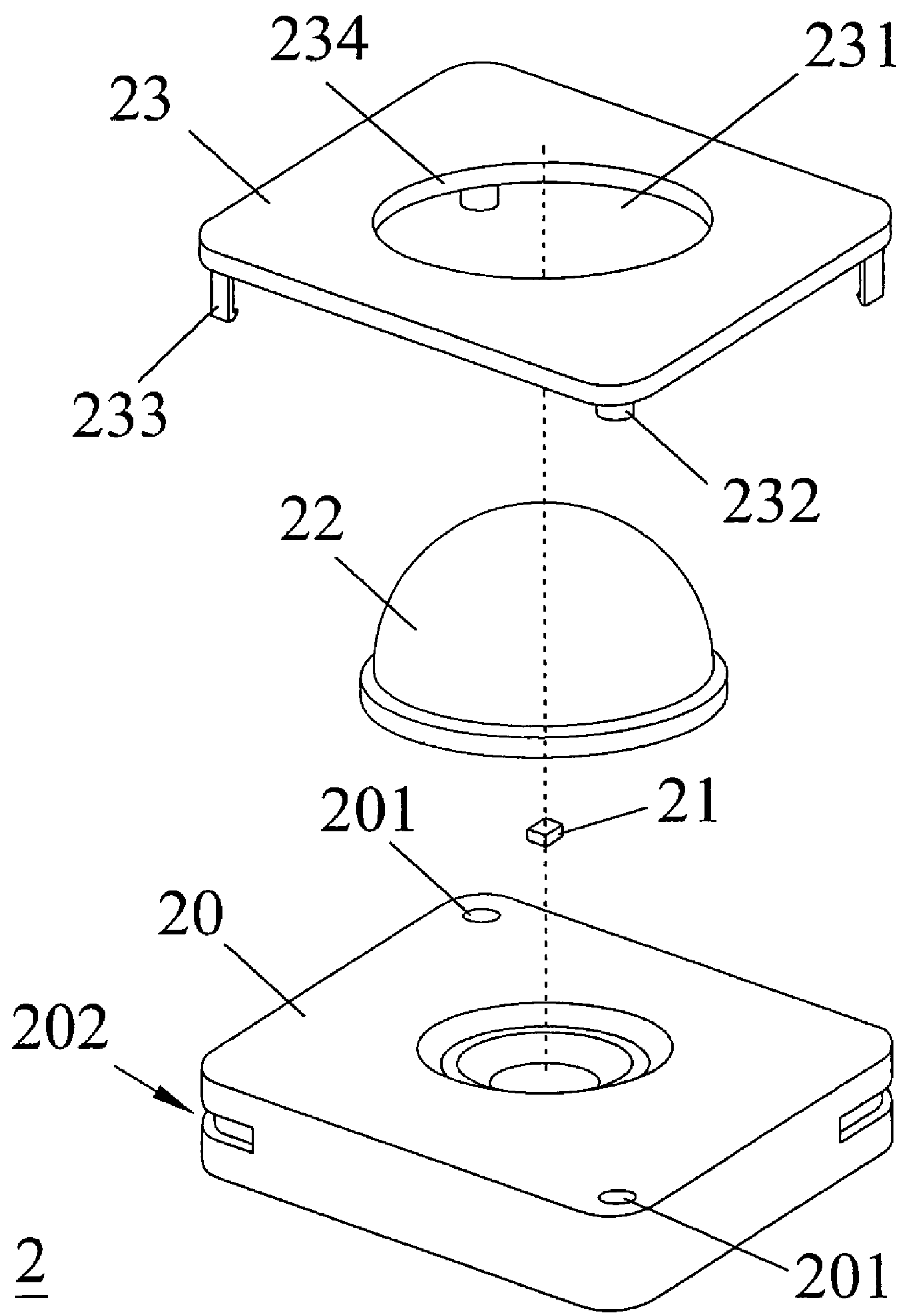
FIG. 3 depicts a schematic exploded view showing the appearance of a package structure for light emitting diode according to a first embodiment of the present invention.
Figure 4:
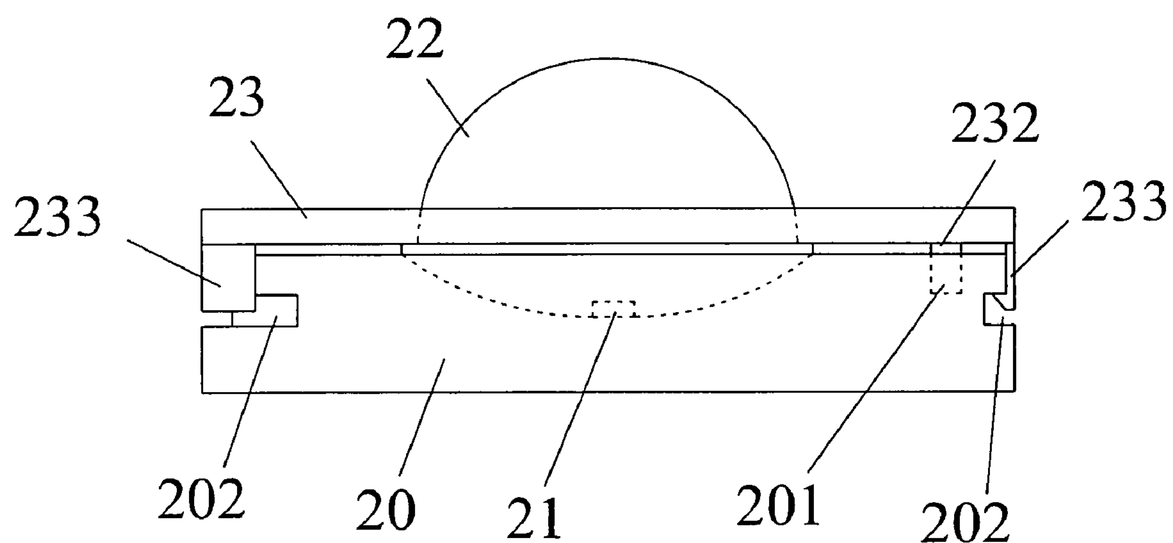
FIG. 4 depicts a side view of a package structure for light emitting diode according to a first embodiment of the present invention.

Referring to FIGS. 3 and 4, a schematic exploded views showing an appearance and a side view of a package structure for light emitting diode according to a first best embodiment of the present invention are depicted respectively. In these drawings, a package structure 2 comprises a base 20, an LED die 21, an optical lens 22 and a lens holder 23. The optical lens 22 covers the LED die 21 to focus the light emitted by the LED die 21 and generate a desired light pattern, and the lens holder 23 is used to fasten the optical lens 22 on the base 20.

The base 20 has at least one holder cavity 201 formed on its one surface and the base 20 has at least one chase 202 formed on its one side surface. The LED die 21 is arranged on the base 20 to emit light. The optical lens 22 is a lens made of optical glass or optical plastics for generating a predetermined light pattern. And the base 20 optionally has a concave surface formed on its surface for accommodating the LED die 21.

The lens holder 23 comprises an opening 231, at least one holder stem 232 and at least one wedge 233, and the positions of the holder stem 232 and the wedge 233 are corresponding to those of the holder cavity 201 and the chase 202. The optical lens 22 is arranged between the lens holder 23 and the base 20, and through the opening 231, and the lens holder 23 is fastened on the base 20 by wedging the wedge 233 with the chase 202 and positioned on the base 20 by embedding the holder stem 232 into the holder cavity 201. According to this package structure, the optical lens 22 can be fastened on the base 20 by the lens holder 23.

In the packaging process, the wedge 233 is aligned to the chase 202, and the holder stem 232 is aligned to the holder cavity 201. Next, the lens holder 23 is pressed downwardly onto the base 20. When the wedge 233 touches the base 20 and continues to be pressed downwardly, the wedge 233 will deform slightly and expand outwardly along the side surface of the base 20 until the wedge 233 is pressed downwardly into the chase 202. The flexibility of the wedge 233 enables the wedge 233 to be returned to its original shape and wedged with the chase 202. Also, that the lens holder 23 pressed downwardly onto the base 20 enables the holder stem 232 to be embedded into the holder cavity 201, thereby further enhancing the positioning of the lens holder 23 on the base 20.

When it is desired to change for a lens with a different light pattern, the wedges 233 of the lens holder 23 can be slightly deformed with simple tools and disengaged from the chases 202, and the lens holder 23, the base 20 and the optical lens 22 can be separated from one another. After changing for an optical lens 22 with a different light pattern, the rapid replacement of the optical lens 22 without damaging the element can be achieved in accordance with the above assembling method.

As known from the above explanation, the supporting stem of the lens holder in a package structure of the prior art must be heat melted and deformed. In comparison with the prior art, the required time of a packaging process can be reduced, and the optical lens can be replaced quickly without damaging the lens holder according to the present invention.

Besides, the lens holder 23 optionally further comprises a reflection layer formed on the internal wall surface 234 of its opening, for example, aluminum or silver is electroplated, or an aluminum-based or a silver-based material is sprayed on the internal wall surface 234 to improve the reflective effect of the internal wall surface 234. In addition, the shape of the base 20 may be optionally changed and is not limited to the rectangle as shown in FIG. 3. The bases of other shape also fall into the protection scope of the present invention.

Figure 5:
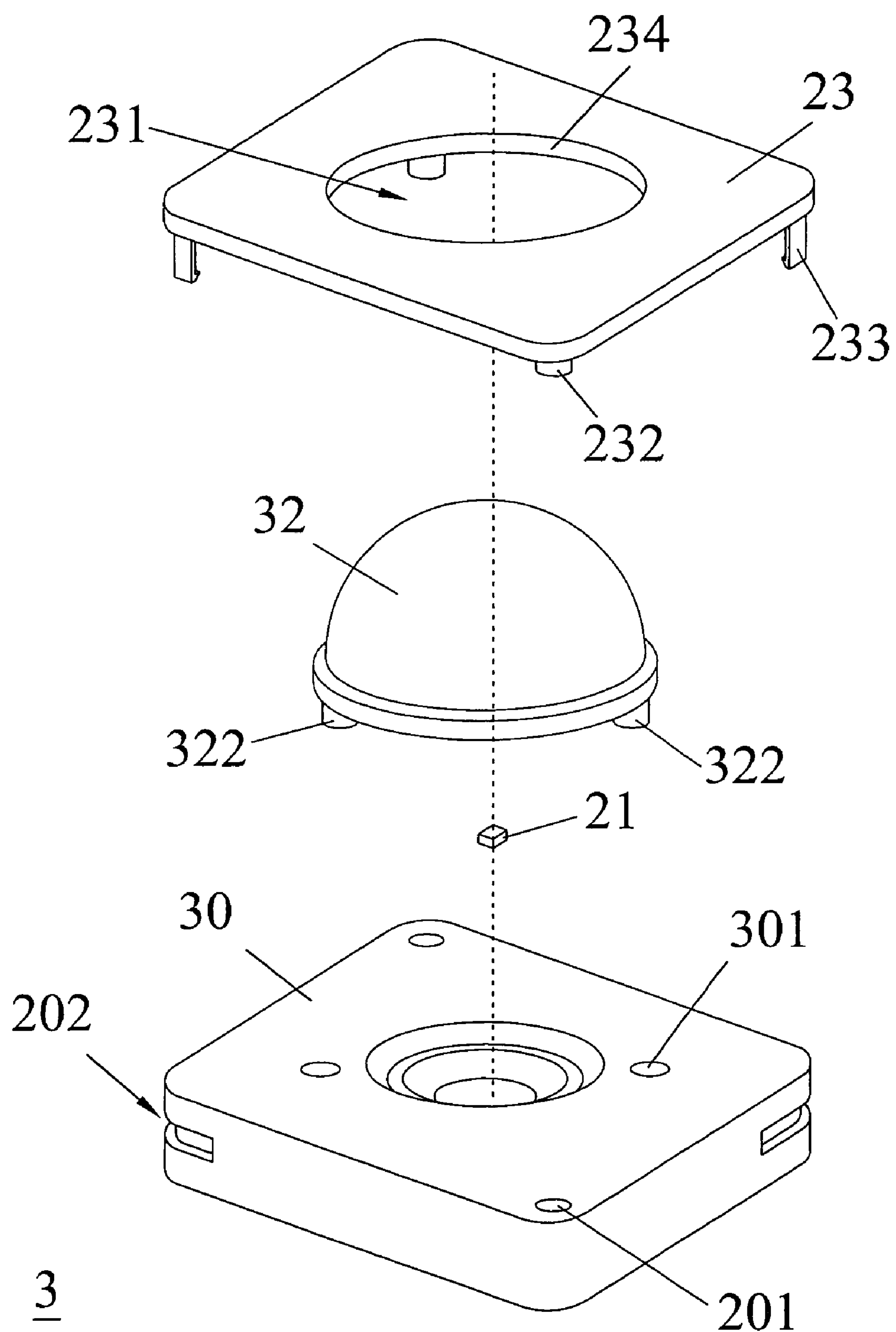
FIG. 5 depicts a schematic exploded view showing the appearance of a package structure for light emitting diode according to a second embodiment of the present invention.

Referring to FIG. 5, there is a schematic exploded view showing an appearance of a package structure for light emitting diode according to a second best embodiment of the present invention. In the drawing, the difference between the package structure 3 and the package structure 2 lies in that the optical lens 32 contained in the package structure 3 has at least one lens stem 322, and the base 30 correspondingly has at least one lens cavity 301 formed on its surface. The optical lens 32 is positioned on the base 30 by embedding the lens stem 322 into the lens cavity 301. Accordingly, the optical lens 32 can be preferably positioned on the base 30 to reduce the possibility of the movement or the rotation of the optical lens 32 caused by an external shake or vibration acted on the package structure 3.

Figure 6:
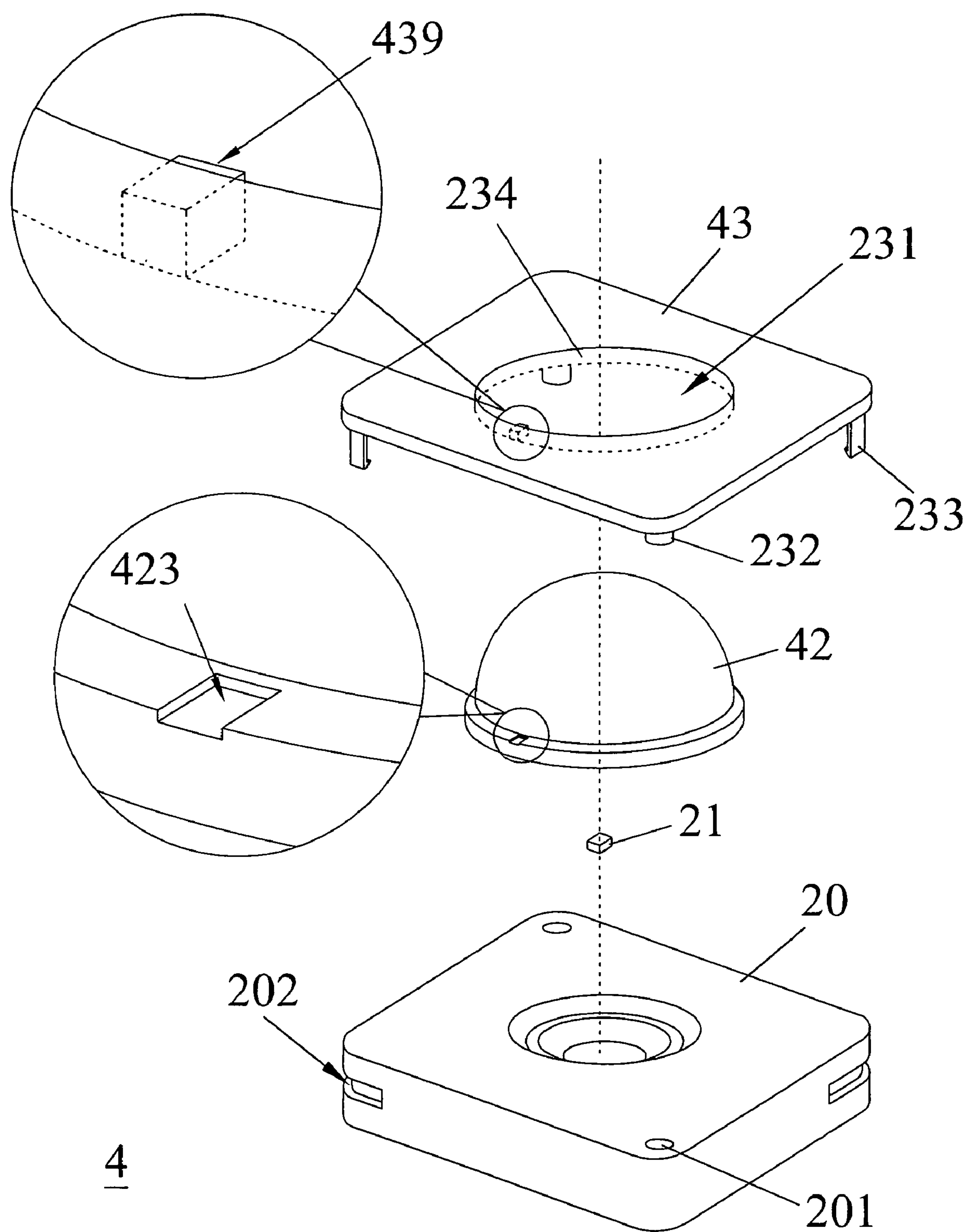
FIG. 6 depicts a schematic exploded view showing the appearance of a package structure for light emitting diode according to a third embodiment of the present invention.

Referring to FIG. 6, there is a schematic exploded view showing an appearance of a package structure for light emitting diode according to a third best embodiment of the present invention. In the drawing, the difference between the package structure 4 and the above package structure 2 lies in that the optical lens 42 contained in the package structure 4 is plastic injection molded and comprises at least one lens alignment 423, and the lens alignment 423 can be arranged in a plastic injection mold and be proceeded injection molded with the optical lens 42 simultaneously, and the lens holder 43 comprises at least one corresponding holder alignment 439 formed on the internal wall 234 of its opening. When the lens holder 43 is fastened on the base 20, the optical lens 42 is positioned by the lens holder 43 in a manner of jointing the holder alignment 439 to the lens alignment 423. Accordingly, the optical lens 42 can be preferably fastened and positioned on the base 20 with the lens holder 43 to reduce the possibility of the movement or rotation of the optical lens 42 caused by external shake or vibration acted on the package structure 4.

Hence, the above lens cavity, lens stem, lens alignment and holder alignment may be optionally used in combination and not restricted to the description of the above embodiments. That is to say, the optical lens can also have both a lens stem and a lens alignment, and the lens holder and the base have a holder alignment and a lens cavity respectively for achieving better positioning and fixation effects.

Figure 7:
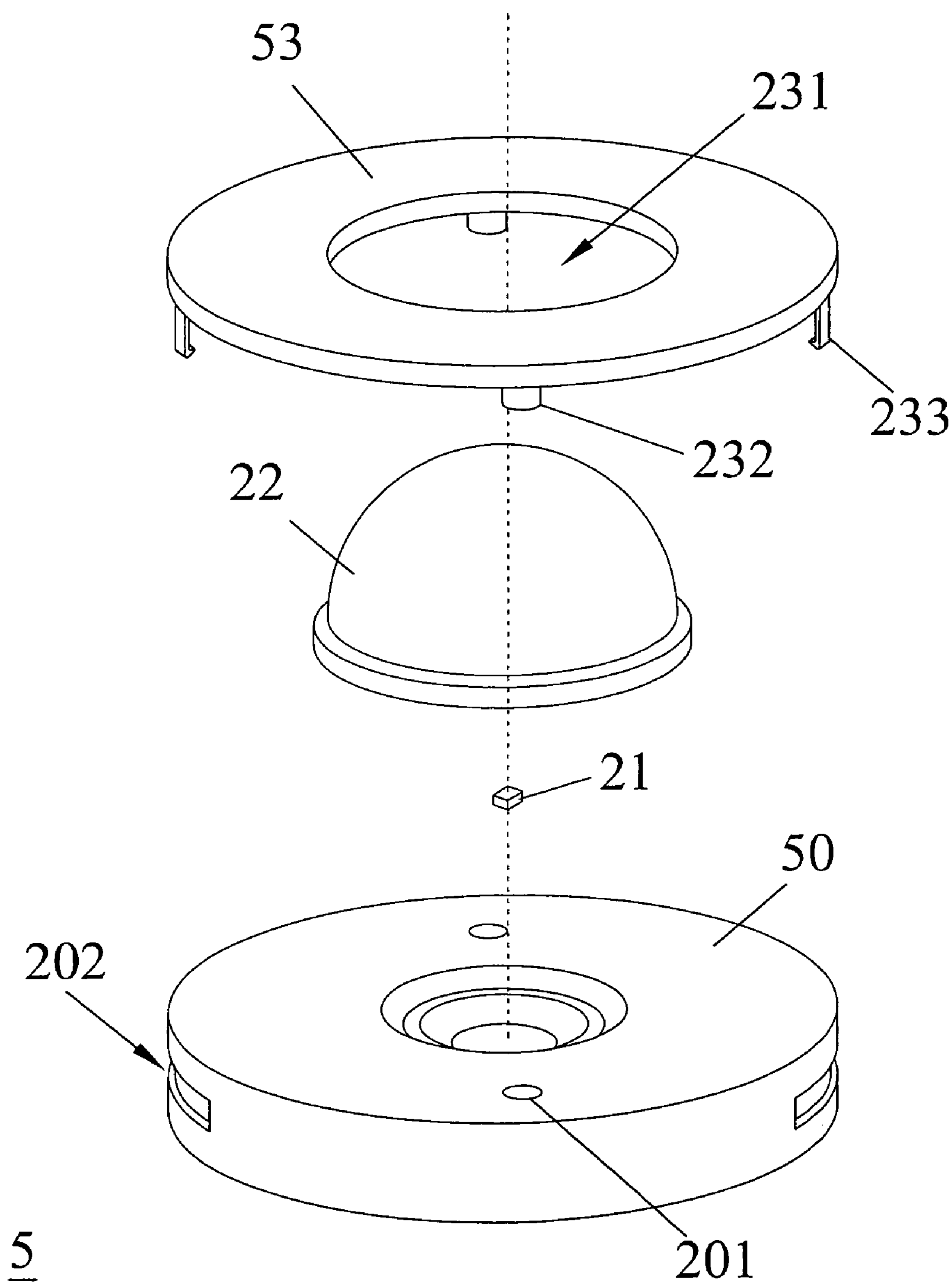
FIG. 7 depicts a schematic exploded view showing the appearance of a package structure for light emitting diode according to a fourth embodiment of the present invention.

Referring to FIG. 7, there is a schematic exploded view showing an appearance of a package structure for light emitting diode according to a fourth best embodiment of the present invention. In the drawing, the difference between the package structure 5 and the above package structures lies in that the base 50 and the lens holder 53 contained in the package structure 5 have a circular shape and are thus suitable for various applications. In this embodiment, the optical lens 52 is fabricated by using a glass precision molding technology, in which a glass perform or a glass material approximated to a final product is placed in a molding mold and then subjected by heating and casting. If applied to a white LED, an optical lens 52 made by a manufacturing technology for phosphor powder inserted glass surface (PIGS) can be used, wherein phosphor powders are doped into the surface layer of a lens in order to have the ability to convert light emitted from an LED to white light. In this embodiment, the circular base 50 comprises holder cavities 201 formed on its surface and chases 202 formed on its one side surface, and the circular lens holder 53 comprises corresponding holder stems 232 and wedges 233 so that the lens holder 53 can be fastened on the base 50 by wedging the wedges 233 with the chases 202 and positioned on the base 50 by embedding the holder stems 232 into the holder cavity 201. Accordingly, the optical lens 52 can be fastened on the base 50 with the lens holder 53 without the limitation of the shape of the base and lens holder. Due to this simple structure, the optical lens 52 made of a rigid glass material can be easily fastened and positioned by using the lens holder 53; the resulted circular LED can be readily mounted in a light fitting or in an automobile lamp for use.

What is claimed is:

1. A package structure for light emitting diode comprising:

a base, which comprises at least one holder cavity formed on one surface thereof and at least one chase formed on one side surface thereof;

an LED die, which is arranged on the base to emit light;

an optical lens, which covers the LED die to focus the light emitted by the LED die and generate a desired light pattern; and a lens holder, which comprises an opening, at least one holder stem and at least one wedge, and the optical lens is disposed between the lens holder and the base, and also through the opening, and the lens holder is fastened on the base by wedging the wedge with the chase and positioned on the base by embedding the holder stem into the holder cavity.

2. The package structure as described in claim 1, wherein the optical lens further comprises at least one lens stem, and the base correspondingly comprises at least one lens cavity formed on the surface thereof, and the optical lens is positioned on the base by embedding the lens stem into the lens cavity.

3. The package structure as described in claim 1, wherein the optical lens further comprises at least one lens alignment, and the lens holder comprises at least one corresponding holder alignment formed on an internal wall of the opening, and when the lens holder is fastened on the base, the optical lens is positioned by the lens holder in a manner of jointing the holder alignment to the lens alignment.

4. The package structure as described in claim 1, wherein the lens holder comprises a reflection layer formed on an internal wall surface of the opening.

5. The package structure as described in claim 1, wherein the optical lens is made of glass or plastic for generating a predetermined light pattern.

6. The package structure as described in claim 4, wherein the reflection layer of the lens holder is formed by electroplating aluminum or silver.

7. The package structure as described in claim 4, wherein the reflection layer of the lens holder is formed by spraying an aluminum-based reflector material.

8. The package structure as described in claim 4, wherein the reflection layer of the lens holder is formed by spraying a silver-based reflector material.

* * * * *